United States Patent [19]

Andrieu et al.

[11] Patent Number: 5,543,245
[45] Date of Patent: Aug. 6, 1996

[54] SYSTEM AND METHOD FOR MONITORING BATTERY AGING

[75] Inventors: Xavier Andrieu, Bretigny Sur Orge; Michel Rocher, Perros Guirec; Philippe Guillaume, Lannion; Philippe Poignant, Palaiseau, all of France

[73] Assignee: Alcatel Converters, Paris, France

[21] Appl. No.: 202,264

[22] Filed: Feb. 25, 1994

[30] Foreign Application Priority Data

Mar. 15, 1993 [FR] France ................... 93 02949

[51] Int. Cl.$^6$ ............................... H01M 10/48
[52] U.S. Cl. .................. 429/90; 429/91; 320/48; 324/434
[58] Field of Search ............ 429/90–93, 50, 429/61; 324/427, 433, 434, 435; 340/636; 320/2, 48, 43, 61, 63

[56] References Cited

U.S. PATENT DOCUMENTS 4,289,836  9/1981  Lemelson ............... 429/93 X
4,957,828  9/1990  Garron .................. 429/92
5,057,383  10/1991  Sokira .................. 429/92
5,159,272  10/1992  Rao et al. ............... 429/93 X
5,284,719  2/1994  Landau et al. ........... 429/93 X

FOREIGN PATENT DOCUMENTS 0112242  6/1984  European Pat. Off. .
0298556  1/1989  European Pat. Off. .
2020828  11/1979  United Kingdom .

Primary Examiner—Anthony Skapars
Attorney, Agent, or Firm—Sughrue, Mion, Zinn, Macpeak & Seas

[57] ABSTRACT

A system for monitoring aging of a battery comprising a plurality of cells connected in series and able to be fully discharged comprises a discharger which discharges one of the previously charged cells at a time to an end of discharge value. The quantity of electricity supplied by each discharged cell during discharging is measured. The quantity of electricity supplied by at least one discharged cell is processed to detect excessive aging of the battery. Excessive aging of the battery results in a residual capacity which is less than a fraction of the nominal capacity of the battery.

32 Claims, 3 Drawing Sheets

END OF DISCHARGE DETECTOR

SYSTEM AND METHOD FOR MONITORING BATTERY AGING

BACKGROUND OF THE INVENTION

1. Field of the Invention

The field of the invention is that of systems for monitoring battery aging. The invention applies in particular to monitoring the aging of backup batteries for optical repeaters, for example. Monitoring of aging checking whether a battery is able to meet a requirement or not, in particular to provide a backup power supply.

The invention also concerns a method for monitoring battery aging. In the remainder of this description the term battery refers to a set of rechargeable cells connected in series.

2. Description of the Prior Art

Backup batteries are frequently used in optical repeaters of optical fiber communication systems. The batteries supply power to a repeater if the main power supply to the repeater derived from the AC line voltage, for example, fails, (i.e., a temporary AC line power outage).

To monitor the aging of backup power supplies two identical batteries are usually connected in parallel by switches, as shown in FIG. 1.

Two batteries 10, 11 are in a circuit comprising two branches. Each battery 10, 11 cooperates with a power switch 12, 13 connected to a load 16 to be supplied with power and to means 14 for measuring the aging of each battery. The batteries 10 and 11 are to supply power to the load 16 if absence or failure of the main power supply of the load 16 is detected. If such failure occurs, the switches 12 and 13 are operated so that the load 16 is connected to the two batteries 10 and 11 in parallel.

The aging of a battery is estimated by operating the associated switch, for example the switch 12 for the battery 10, and causing the battery to discharge current into the measuring means 14 which include means for discharging the battery connected to a voltage reference Uref representing a given percentage, for example 50%, of the nominal capacity of a charged battery.

FIG. 2 shows various battery voltage characteristics as a function of the state of charge (S.C.) expressed as a percentage.

The characteristics 20 through 22 are for lead-acid batteries. Characteristic 20 is for a brand new lead-acid battery, characteristic 21 for the same battery after use for a certain period and characteristic 22 for the same battery after use for a long period. If the voltage Uref is set at 50% of the nominal capacity of a battery functioning perfectly, discharging a used battery of the same type to Uref does not provide the same capacity (quantity of electricity). The residual capacity can be determined by measuring the energy supplied by the battery under test until the voltage across it reaches Uref.

For example, a brand new 10 Ah battery may have a capacity of only 5 Ah after ten years and it is therefore necessary to know how it has aged in order to ensure that the backup power supply system operates correctly.

To this end the measuring means 14 include means for measuring the capacity (in Ah) output by the battery under test from its maximally charged state to the reference voltage Uref. If the battery under test no longer delivers sufficient capacity, it is deemed to be too old and the module 14 reports this to an operator who can then replace it. This reporting is usually done via a transmission bus 15 which provides a remote maintenance link for checking the condition of the batteries.

If the battery is still operational, i.e. if the capacity output when it is discharged is sufficient, the measuring means 14 recharge it before testing the other battery.

The main drawback of this type of system for monitoring battery aging is that it requires two batteries because the backup power supply provided by the two batteries may be required at any time. In some cases only 75% of the total capacity is available, i.e. when one of the batteries is discharged 50% (at the end of the cycle for checking its charge) and the other is fully charged. Increasing the number of batteries is not an acceptable solution because this increases the cost of the backup power supply system and it is necessary to provide a greater number of power switches, one per battery, and these switches are costly if the current drawn by the device is high.

The batteries used in this type of backup power supply are lead-acid batteries and in this case further discharging a battery already discharged 50% may destroy it. This can occur when, at the end of discharging a battery in order to test its residual capacity, the backup power supply is required to supply power to the load 16.

Also, lead-acid batteries have electrochemical properties which fall well short of those of more recent battery types such as nickel-cadmium batteries. Nickel-cadmium batteries have a characteristic like that of line 23 in FIG. 2 (i.e. the battery voltage remains substantially constant throughout discharge). This means that it is not possible to detect when the voltage across these batteries falls below the voltage Uref without entirely discharging the battery.

The use of two nickel-cadmium backup batteries, whose aging is tested as shown in FIG. 1, therefore leads to a remaining overall capacity of only 50% on completion of testing one battery. If the backup power supply is required immediately following failure of the main power supply, this residual capacity of 50% may be insufficient. To retain the 75% capacity obtainable with lead-acid batteries it is therefore necessary to use four nickel-cadmium type batteries and therefore to increase the number of switches.

One specific object of the present invention is to alleviate these drawbacks.

To be more precise, one object of the invention is to provide a system for monitoring the aging of a backup power supply using only one battery.

Another object of the invention is to enable the use of batteries which can be fully discharged, such as nickel-cadmium, nickel-hydride or lithium-carbon batteries, which increases the capacity of the backup power supply.

SUMMARY OF THE INVENTION

These objects, and others that emerge below, are achieved by a system for monitoring aging of a battery comprising a plurality of cells connected in series and able to be fully discharged, said system comprising:

discharger means adapted to discharge one of said previously charged cells at a time to an end of discharge value;

measuring means for measuring the quantity of electricity supplied by each discharged cell during discharging thereof; and processor means for processing the quantity of electricity supplied by at least one discharged cell adapted to detect excessive aging of said battery.

The system of the invention therefore discharges at least one of the cells of a battery, a backup battery, for example, to monitor the aging of the battery as a whole. As a cell can be discharged in circuit, i.e. without disconnecting the battery from the load which it is to supply with power, the capacity of the battery as a whole is preserved, only a fraction of the available energy being drawn off.

The system of the invention advantageously further comprises charger means for charging each of said discharged cells after discharging thereof.

In a preferred application, the battery is the backup battery of a backup power supply substituted for a main power supply upon failure of said main power supply.

The processor means advantageously generate an alarm signal if excessive aging of the battery is detected, the alarm signal being transmitted over a transmission bus. This provides for remote maintenance of the backup battery.

In an advantageous embodiment, the discharger means discharge each cell at constant current and the end of discharge value corresponds to the end of discharge time, at which the constant current can no longer be supplied by the cell concerned, and in this case the processor means comprise means for measuring the time to discharge the cell concerned to the end of discharge time, which is indicative of the residual capacity of the cell under test.

In another embodiment, the discharger means discharge each cell at constant current and the end of discharge value is a reference voltage.

The discharger means are preferably controlled by a control voltage determining the constant discharge current.

Each cell can cooperate with respective discharger means dedicated to it or the discharger means are common to all the cells and cooperate with multiplexing means addressing the cells to be discharged.

The charger means can comprise a single current generator for generating the trickle charging current of the battery. Between discharging of one cell and the start of discharging of another cell or the same cell, time is allowed for recharging the discharged cell.

The processor means advantageously compares the sum of the quantities of electricity supplied by each discharged cell with a fraction of the sum of the nominal capacities of the discharged cells and generates an alarm signal if said sum becomes less than said fraction.

The invention also consists in a method of monitoring aging of a battery comprising a plurality of cells connected in series, said method consisting in:

discharging one of the previously charged cells at a time to a predetermined end of discharge value;

measuring the quantity of electricity supplied by each discharged cell during discharging thereof; and processing the quantity of electricity supplied by at least one discharged cell and, where applicable, generating an alarm message if excessive aging of the battery is detected.

In a first embodiment of the method of the invention, the processing of the quantities of electricity supplied by the discharged cells consists in summing said quantities of electricity, and the alarm message is generated if this sum is less than a predetermined capacity threshold. This method can be used if the cells of the battery have characteristics which do not differ greatly.

In another embodiment of the method of the invention, the processing of the quantities of electricity supplied by each discharged cell consists in measuring the variation in the sum of the quantities of electricity supplied by the discharged cells between two successive discharges of the cells, and the alarm message is generated if this variation exceeds a predetermined value. This detects rapid loss of overall capacity, indicating that the battery will soon be unable to meet the demands put on it.

In a further embodiment of the method of the invention, the processing of the quantity of electricity supplied by a discharged cell consists in extrapolating the variation in time of the capacity of the cell, and the alarm message consists in transmission of the time required by the cell to reach a specified minimal capacity. This alerts an operator that the battery will soon be unable to meet the demands put on it.

Other features and advantages of the invention emerge from the following description of two preferred embodiments of the invention given by way of non-limiting illustrative example only with reference to the appended drawings.

DETAILED DESCRIPTION OF THE PREFERRED EMBODIMENTS

Figure 1:
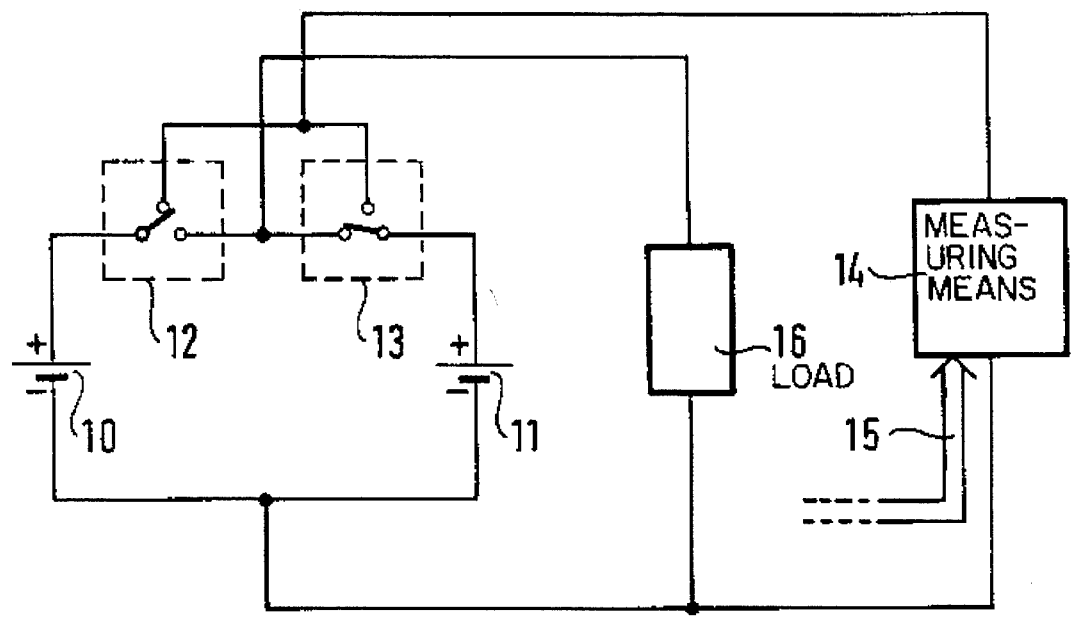
FIG. 1 shows a backup power supply associated with a system for monitoring aging of the backup power supply.
Figure 2:
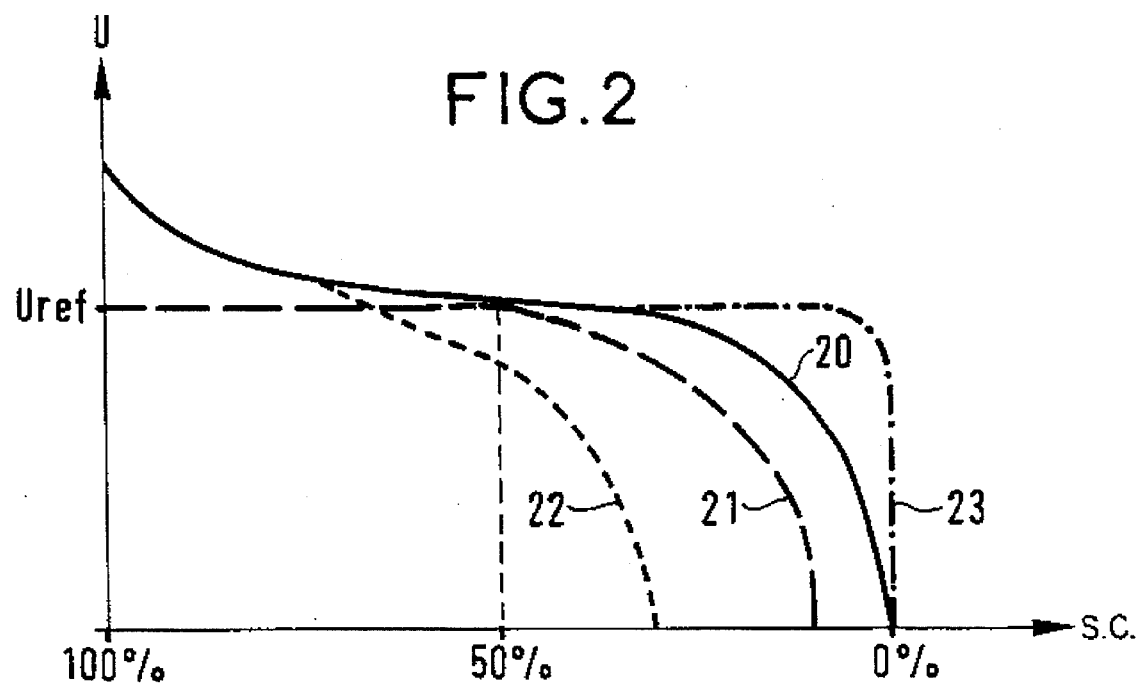
FIG. 2 shows characteristics of lead-acid batteries and a nickel-cadmium battery.

FIGS. 1 and 2 are described above with reference to the prior art.

The invention exploits the fact that a battery comprises a plurality of rechargeable cells in series, the voltage at the battery terminals being equal to the sum of the voltages of the various cells. The aging of the various cells or even a single cell (see below) is representative of aging of the entire battery.

Figure 3:
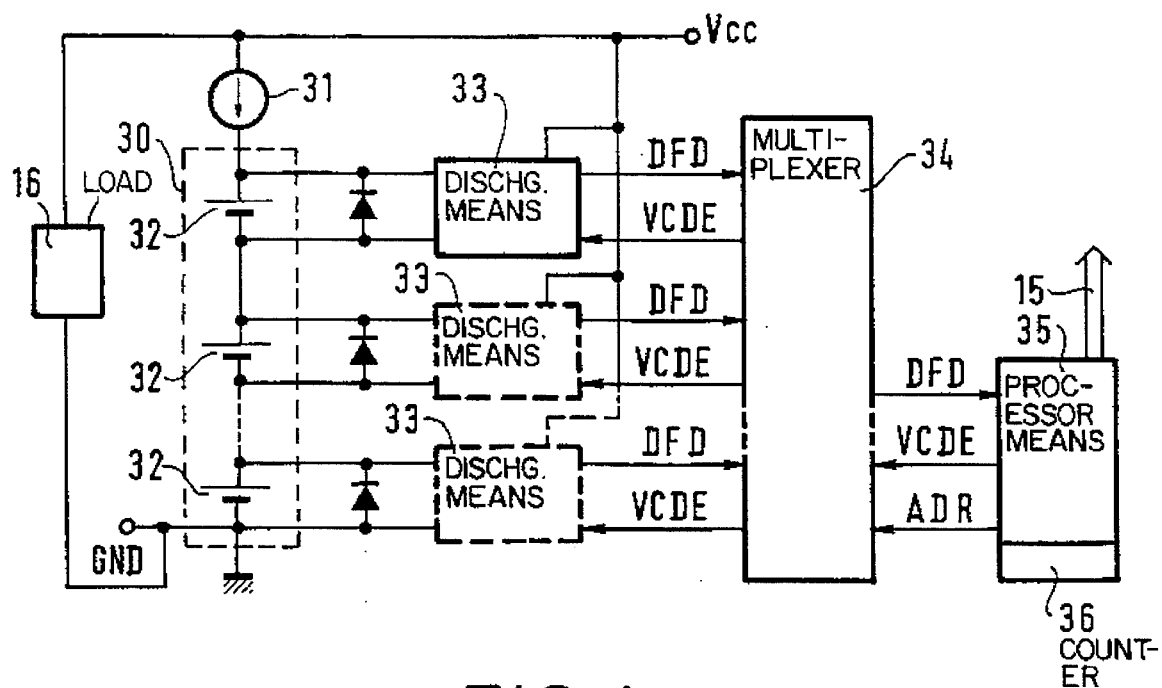
FIG. 3 is a block diagram of a first embodiment of a system for monitoring aging of a battery constituting a backup power supply, for example.

FIG. 3 is a block diagram of a first embodiment of a system for monitoring aging of a battery constituting a backup power supply.

A battery 30 serves as the backup power supply of a load 16, such as an optical repeater. The main power supply of the load 16 may be a power supply (not shown) connected to the AC line voltage and producing a DC voltage Vcc. The current for trickle charging the battery 30 is provided by a current generator 31. The battery 30 comprises a plurality of cells 32 connected in series, only three of which are shown here. The term "battery cell" is to be understood as meaning a single cell (a positive terminal, a negative terminal and an electrolyte) or a plurality of (at least) two cells connected in series.

Figure 4:
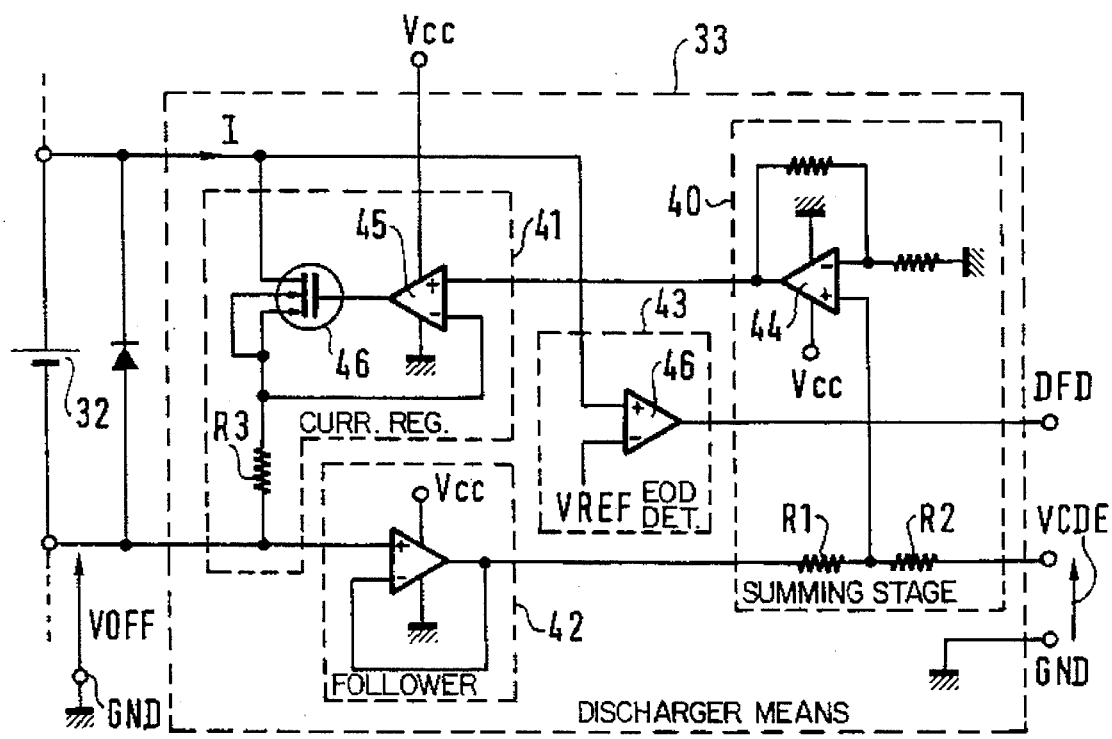
FIG. 4 shows one embodiment of a discharger module that can be associated with each battery cell.

Each cell 32 cooperates with modular discharger means 33 supplied with power by the main power supply. FIG. 4 shows one possible design of discharger module 33.

Each module 33 includes a summing stage 40, a current regulator stage 41, a follower stage 42, and an end of discharge detector stage 43.

The summing stage 40 receives a control voltage Vcde from a multiplexer 34 (FIG. 3) at one end of a resistor R2, the other end of which is connected to the input of an operational amplifier 44 configured as a voltage amplifier. The resistor R2 is in series with a resistor R1 which, via the follower stage 42, receives an offset voltage Voff equal to the voltage between the negative terminal of the battery 30 and the negative terminal of the cell 32 under test.

The output voltage of the amplifier 44 is applied to the positive input of an operational amplifier 45 of the current regulator stage 41. The output of the amplifier 45 is connected to a switch, in this example an N-channel MOSFET power transistor 46. The output of the amplifier 45 is connected to the gate of the transistor 46 whose source is connected to the positive terminal of the cell 32 and whose drain is connected to a shunt resistor R3 and to the negative input of the amplifier 45. The other end of the shunt resistor R3 is connected to the negative terminal of the cell 32.

This provides a constant current absorber, the constant current depending on the voltage Vcde. The resistors of the summing stage 40 have values computed for each discharger module 33 so that the current I supplied by the cell 32 connected to this stage is equal to Vcde/R3. It is therefore possible to retain a control voltage Vcde relative to ground and to discharge each cell at the same constant current.

The end of discharge detector stage 43 can include a comparator 46 which compares the voltage supplied by the cell 32 with a reference voltage Vref and indicates by means of an end of discharge detected signal DFD that the voltage has fallen below the reference voltage Vref.

In an alternative embodiment the stage 43 comprises means for sensing that the cell 32 under test is incapable of delivering the required current I. A device such as that shown in FIG. 5 can be used for this purpose, for example.

Figure 5:
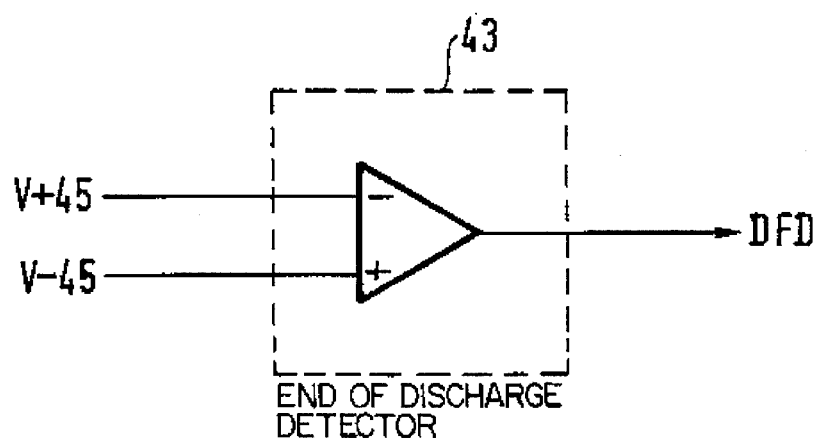
FIG. 5 is a block diagram of a device for sensing that a cell under test is incapable of supplying the constant current required of it.

FIG. 5 shows the block diagram of a device for detecting that the cell 32 under test is incapable of supplying the required constant current I. At the start of discharging of the cell 32 the voltage V+45 applied to the positive input of the operational amplifier 45 is slightly greater than the voltage V−45 at its negative input. If the cell 32 can no longer supply the required current I voltage V−45 falls below the V+45 and DFD goes to logic "1".

The end of discharge detected signal DFD is fed to processor means 35 (FIG. 3) in the form of a microprocessor, for example, including a counter 36 triggered at the start of discharging each cell 32. By discharging each previously charged cell at constant current and measuring the time until the end of discharge is detected (by comparison with a reference voltage Vref or preferably by detecting the inability to supply the required current I), the processor means 35 can estimate the quantity of electricity (in Ah) supplied by each cell 32.

In an alternative embodiment the cells 32 are discharged at varying current for a predetermined time. Again, at the end of discharge the quantity of electricity supplied by each cell is known.

The cell under test is addressed over an address bus ADR which sets the multiplexer 34 to test a given cell. This addressing is preferably on a rotating basis so that all the cells are tested cyclically in turn.

Each cell 32 cooperates with a diode (not shown) protecting it against polarity reversal if the battery 30 is required to supply power during testing of a cell. This terminates the test in progress. These diodes are Schottky type diodes, for example.

After a cell is discharged it is of course necessary to recharge it. This is done using the current generator 31, for example, which is activated at all times, even during the tests. To this end the voltage Vcde is calibrated to allow for the trickle charge current. Before discharging another cell it is necessary to wait for a time at least equal to the duration of the standard trickle charge cycle, which depends on the current output of the generator 31.

It is also possible to integrate a cell recharging function into each module 33.

When all the cells 32 constituting the battery 30 have been tested the measuring and processor means 35 can compute the percentage residual capacity of the battery. To this end the processor means 35 can, for example, sum the quantities of energy supplied by the discharged cells and compare this sum with a fraction of the sum of the nominal capacities of the discharged cells, related to the nominal capacity of the battery 30. The processor means 35 then generate an alarm signal if this sum falls below this fraction of the nominal capacity.

For example, if the sum of the residual capacities of the various cells, given by the sum of the quantities of electricity supplied by these cells, falls below 80% of the nominal capacity of the battery an alarm signal is generated and passed to an operator.

In fact, the sum of the residual capacities is representative of the state of aging of the battery only if the cells are homogeneous, i.e. if there is little dispersion of their characteristics in time. In this case the measured residual capacity of a single cell of the battery is representative of the residual capacity of the entire battery and the testing of the battery 30 can be restricted to testing just one of its cells.

On the other hand, if the cells of the battery under test are heterogeneous (i.e. they show dispersion of their characteristics), it is possible to calculate the statistical distribution of the residual capacity of the cells. Aging can be indicated by a decrease in the mean residual capacity and by an increase in the dispersion of the residual capacities.

The battery monitoring means 35 are preferably designed to cause an alarm signal to be transmitted to a remote location in any of the following circumstances, all of which indicate detection of aging of the battery 30:

the overall capacity falls below a specified minimum capacity (valid for homogeneous cells);

a significant variation in capacity is noted between two successive measurements;

extrapolation of the variation with time of the capacity of a cell gives the time needed to reach the specified minimal capacity.

This latter alarm criterion allows preventive maintenance of the battery. The alarm indication tells the operator that the battery must be replaced.

The reason why two of the discharger means 33 are shown in dashed outline in the drawing is that the aging of the battery 30 can be monitored by testing a single cell 32. If the cells of a battery are identical there is not usually any significant dispersion of their characteristics and it is possible to determine the condition of the battery from any of its cells.

Thus a system in accordance with the invention for monitoring battery aging can comprise only discharger means 33 adapted to discharge at least one of the previously charged cells 32 as far as an end of discharge value, means for measuring the quantity of electricity supplied by each cell 32 discharged during its discharge, and means for processing the quantity of electricity supplied by at least one discharged cell 32 adapted to detect excessive aging of the battery 30.

It must be borne in mind that the term "battery cell" is to be understood as meaning a single cell (a positive terminal, a negative terminal and an electrolyte) or a plurality of (at least) two cells connected in series.

If all the cells are homogeneous, which is usually the case, each cell is representative of the state of charge of the battery. On the other hand, if the cells are heterogeneous the residual capacity of the battery is not equal to the mean of the residual capacities of the cells.

Figure 6:
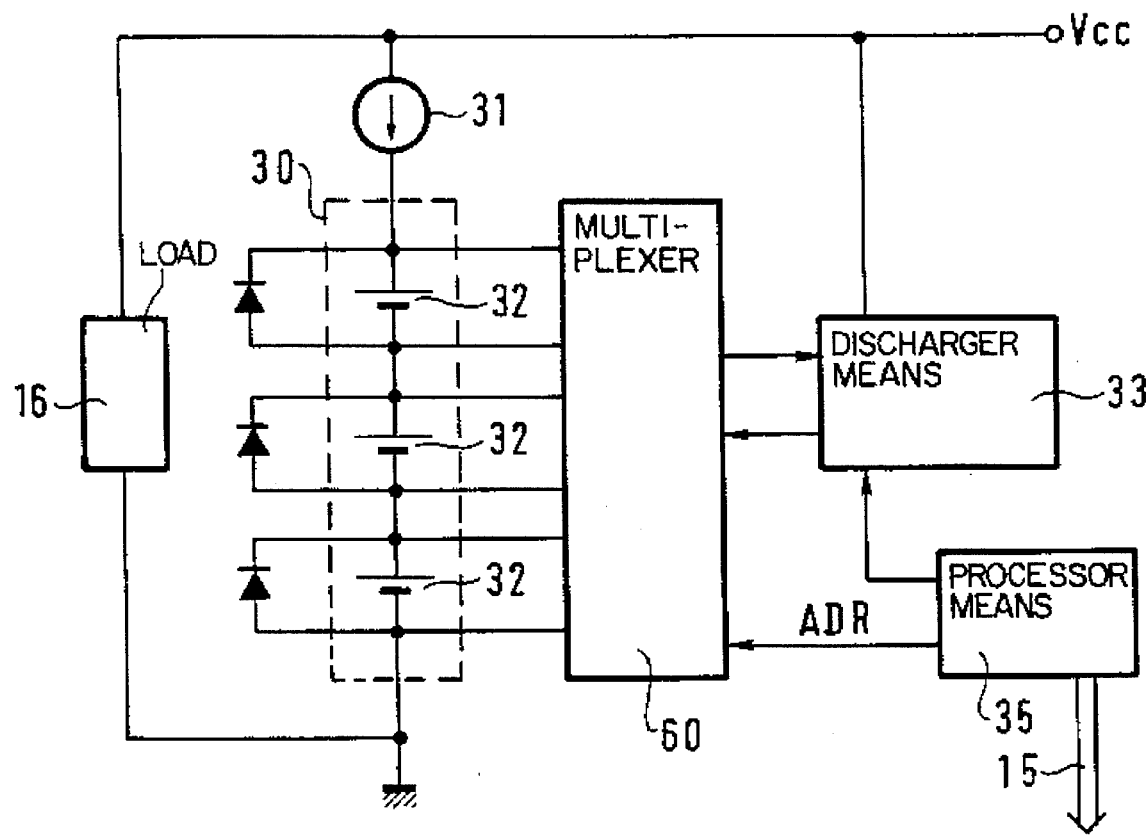
FIG. 6 is a block diagram of a second embodiment of a system for monitoring battery aging.

In another embodiment of the system of the invention, shown in FIG. 6, there is a single discharger means 33 cooperating with the cell(s) 32 of the battery 30 under test through a multiplexer 60 constituting demultiplexing means controlled by the measuring and processor means 35 which can address any cell 32 of the battery 30 over the link ADR and connect the cell to the discharger means 33.

The cells discharged can be recharged by the trickle charge current generator 31 or by the discharger means 33. The multiplexer 60 preferably comprises solid-state relays with a low internal resistance. To test the battery 30 completely each cell 32 of the battery is discharged and then recharged in turn and the quantity of electricity supplied by each cell 32 is used to estimate the condition of the battery 30.

In another aspect the invention consists in a method of monitoring the aging of a battery comprising a plurality of cells connected in series, which method:

discharges only one previously charged cell at a time as far as a predetermined end of discharge value;

measures the quantity of electricity supplied by each cell discharged during its discharging; and processes the quantity of electricity supplied by at least one discharged cell and, optionally, generates an alarm message if excessive aging of the battery is detected.

A single cell may be discharged, as described above, or cells connected in series. It is of course equally feasible to discharge simultaneously cells which are not in series, i.e. not directly connected, for example the first and the last cell of the battery. This procedure is deemed to be equivalent to discharging a single cell or cells in series.

The processing of the quantities of electricity supplied by discharged cells may consist in simply summing these quantities of electricity, and in this case an alarm message is generated if this sum is less than a predetermined capacity threshold. Returning to the previous numerical example, the predetermined capacity threshold is set at 80% of the expected capacity. Below this residual capacity the battery is deemed to be no longer capable of supplying the load.

The processing of the quantities of electricity supplied by each discharged cell can alternatively consist in measuring the variation of the sum of the quantities of electricity supplied by the discharged cells obtained by two successive discharges of those cells. In this case the alarm message is generated if this variation in the quantity of electricity becomes greater than a predetermined value. Any significant decrease in the residual capacity indicates aging of the cells tested and therefore of the backup battery.

The aging of the battery can instead be estimated by considering only one cell (single cell or group of cells in series). The processing of the quantity of electricity supplied by this discharged cell may consist in extrapolating the variation in time of the capacity of the cell, for example, in which case the alarm message gives the time required by this cell to reach a specified minimal capacity. In this way excessive aging of the battery can be predicted.

In the present invention the discharging of a battery cell reduces the voltage at the battery terminals by an amount which may be of no consequence for the load supplied by the battery. However, if this voltage drop has to be compensated, an additional cell can be provided, connected in series with the other battery cells.

The invention applies in particular to high-voltage batteries (48 volt batteries, for example) which comprise a large number of cells in series. The loss of energy due to testing a cell is 1/n where n is the number of cells in the battery, unlike the prior art where the loss of energy is at least 25%.

The invention applies to batteries which can be fully discharged such as nickel-cadmium, lithium, nickel-hydride and lithium-carbon batteries. Discharging a cell of a battery of this kind to a very high percentage, or even completely, is furthermore a welcome feature as it reconditions the cell and increases its life.

There is claimed:

1. A system for monitoring aging of a battery which comprises a plurality of cells connected in series and able to be fully discharged, said system comprising:

discharger means for discharging a previously-charged one of said plurality of cells at a time, to an end of discharge value;

measuring means for measuring a respective quantity of electricity supplied by said previously-charged one of said plurality of cells during discharging thereof; and processor means for processing said respective quantity of electricity to detect excessive aging of said battery.

2. The system according to claim 1, further comprising charger means for charging each of said plurality of cells after discharging thereof.

3. The system according to claim 1, wherein said battery is a backup battery of a backup power supply which is substituted for a main power supply upon failure of said main power supply.

4. The system according to claim 1, wherein:

said processor means generates an alarm signal if said excessive aging of said battery is detected, and said alarm signal is transmitted over a transmission bus.

5. The system according to claim 1, wherein:

said discharger means discharges each respective one of said plurality of cells at constant current, said end of discharge value corresponds to an end of discharge time instant at which said constant current can no longer by supplied by said respective one of said plurality of cells, and said processor means comprises means for measuring a duration of time to discharge said respective one of said plurality of cells to said end of discharge time instant.

6. The system according to claim 1, wherein said discharger means discharges each of said plurality of cells at constant current and said end of discharge value is a reference voltage.

7. The system according to claim 1, wherein said discharger means is controlled by a control voltage determining said constant current.

8. The system according to claim 1, wherein each of said plurality of cells cooperates with respective, dedicated discharger means.

9. The system according to claim 1, wherein said discharger means is common to all of said plurality of cells, and cooperates with multiplexing means for addressing a respective one of said plurality of cells which is to be discharged.

10. The system according to claim 1, wherein said charger means comprises a single current generator for generating a trickle charging current of said battery.

11. The system according to claim 1, wherein said processor means compares (1) a first sum of respective quantities of electricity for said plurality of cells during discharging thereof with (2) a fraction of a second sum of nominal capacities of said plurality of cells, and generates an alarm signal if said first sum becomes less than said fraction of said second sum.

12. The system according to claim 1, wherein said battery is one of a nickel-cadmium battery, a nickel-hydride battery, and a lithium-carbon battery.

13. A method of monitoring aging of a battery which comprises a plurality of cells connected in series, said method comprising the steps of:

discharging one of said plurality of cells at a time to a preselected end of discharge value;

measuring a respective quantity of electricity supplied a respective one of said plurality of cells during discharging thereof; and processing said respective quantity of electricity to detect excessive aging of said battery, and generating an alarm message when said excessive aging of said battery is detected.

14. The method according to claim 13, wherein:

said processing step includes a step of summing respective quantities of electricity for said plurality of cells during discharging thereof to provide a sum; and said alarm message of said generating step is generated when said sum is less than a preselected capacity threshold.

15. The method according to claim 13, wherein:

said processing step includes a step of measuring a variation in a sum of respective quantities of electricity for said plurality of cells during discharging thereof between two successive discharges of said plurality of cells; and said alarm message of said generating step is generated when said variation exceeds a preselected value.

16. The method according to claim 13, wherein:

said processing step includes a step of calculating a cell replacement value for said respective one of said plurality of cells, said cell replacement value indicating a future time at which said respective one of said plurality of cells should be replaced, said cell replacement value being based on a plurality of successive measurements of a variation in time of a capacity of said respective one of said plurality of cells; and said alarm message of said generating step includes transmission of a measurement of a time interval required by said respective one of said plurality of cells to reach a specified minimal capacity.

17. A system for monitoring the aging of a fully dischargeable battery that has series-connected cells, said system comprising:

a discharger for discharging, one at a time, a respective cell of said battery;

means for measuring a respective quantity of electricity supplied by said respective cell, and a processor;

wherein each of said series-connected cells has a respective nominal cell capacity, and a respective cell charging range of 0% to 100% of said respective nominal cell capacity;

wherein said discharger discharges said respective cell to a preselected end of discharge value, which is within said respective cell charging range;

wherein said measuring means provides a measurement of said respective quantity of electricity of said respective cell at said preselected end of discharge value; and wherein said processor detects excessive aging of said battery by processing said measurement of said respective quantity of electricity.

18. The system according to claim 17, further comprising:

a charger for charging each of said series-connected cells after discharging thereof.

19. The system according to claim 17, wherein:

said battery is a backup battery of a backup power supply; and said backup power supply is substituted for a main power supply upon failure of said main power supply.

20. The system according to claim 17, wherein:

said processor generates an alarm signal in response to detecting said excessive aging; and said alarm signal is transmitted over a transmission bus.

21. The system according to claim 17, wherein:

said discharger discharges said respective cell at a preselected constant battery discharge current;

a respective discharge time of said respective cell is defined by a time duration which:

begins at a start of discharging of said respective cell at said preselected constant battery discharge current, and ends when said respective cell can no longer supply said preselected constant battery discharge current; and said processor comprises means for measuring said respective discharge time.

22. The system according to claim 17, wherein:

said discharger discharges each of said series-connected cells at a preselected constant battery discharge current; and said preselected end of discharge value is represented by a reference voltage.

23. The system according to claim 17, wherein:

said discharger is controlled by a control voltage which determines a constant battery discharge current.

24. The system according to claim 17, wherein:

each of said series-connected cells is discharged by a respective dedicated discharger.

25. The system according to claim 17, wherein:

said discharger is common to all of said series-connected cells;

said system further comprises a multiplexer for operably coupling said discharger with said respective cell to be discharged.

26. The system according to claim 18, wherein:

said charger comprises only one current generator for generating a trickle charging current for said battery.

27. The system according to claim 17, wherein:

said processor compares (1) a first sum of said measurements of said respective quantity of electricity for all of said series-connected cells with (2) a preselected fraction of a second sum of each respective nominal cell capacity of all of said series-connected cells; and said processor generates an alarm signal if said first sum is less than said preselected fraction of said second sum.

28. The system according to claim 17, wherein:

said battery is selected from the group consisting of a nickel-cadmium battery, a nickel-hydride battery, and lithium-carbon battery.

29. A method of monitoring the aging of a battery comprising series-connected cells, said method comprising the steps of:

discharging, one at a time, a respective cell of said battery to a preselected end of discharge value, wherein said preselected end of discharge value is within a respective cell charging range of 0% to 100% of a respective nominal cell capacity of said respective cell;

measuring a respective quantity of electricity supplied by said respective cell during discharging thereof to provide a measurement of said respective quantity of electricity;

processing said measurement of said respective quantity of electricity to detect excessive aging of said battery; and generating an alarm message in response when said excessive aging is detected.

30. The method according to claim 29, wherein:

said processing step includes a step of summing said measurement of said respective quantity of electricity for every said respective cell to provide a sum; and said excessive aging is detected when said sum is less than a preselected capacity threshold, which has a value selected from a range of 0% to 100% of a nominal battery capacity of said battery.

31. The method according to claim 29, wherein:

said processing step includes a step of measuring a variation in a sum of said measurement of said respective quantity of electricity for every said respective cell between two successive discharges of every said respective cell; and said excessive aging is detected when said variation exceeds a preselected variation value greater than 0.

32. The method according to claim 29, wherein:

said processing step includes a step of calculating a replacement factor for said respective cell, said replacement factor being based on a plurality of successive measurements of a variation in an actual capacity of said respective cell, said replacement factor indicating when said respective cell will have said actual capacity equal to or less than a preselected minimal capacity;

said alarm message includes a representation of said replacement factor; and said preselected minimal capacity is a value selected from said respective cell charging range.

* * * * *